(12) United States Patent
Yu

(10) Patent No.: US 6,265,250 B1
(45) Date of Patent: Jul. 24, 2001

(54) METHOD FOR FORMING SOI FILM BY LASER ANNEALING

(75) Inventor: Bin Yu, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/406,169

(22) Filed: Sep. 23, 1999

(51) Int. Cl.⁷ .......................... H01L 21/84; H01L 21/20; C30B 1/00

(52) U.S. Cl. .......................... 438/162; 438/164; 438/407; 438/479; 438/486; 117/8

(58) Field of Search .................... 438/162, 311, 438/479, 313, 322, 487, 164, 407; 117/8, 9, 10, 904

(56) References Cited

U.S. PATENT DOCUMENTS

| | | | |
|---|---|---|---|
| 4,651,190 | * 3/1987 | Suzuki et al. .................... | 357/45 |
| 5,373,803 | * 12/1994 | Noguchi et al. .................... | 117/8 |
| 5,457,058 | * 10/1995 | Yonehara .................... | 437/24 |
| 5,534,459 | * 7/1996 | Kim .................... | 437/89 |
| 5,581,101 | * 12/1996 | Ning et al. .................... | 257/347 |
| 5,627,086 | * 5/1997 | Noguchi .................... | 438/162 |
| 5,904,550 | * 5/1999 | Yamaguchi .................... | 438/437 |
| 5,950,097 | * 9/1999 | Chang et al. .................... | 438/506 |

* cited by examiner

*Primary Examiner*—Olik Chaudhuri
*Assistant Examiner*—Shrinivas H. Rao
(74) *Attorney, Agent, or Firm*—Lariviere, Grubman & Payne, LLP

(57) ABSTRACT

A method for making a ULSI MOSFET using silicon on insulator (SOI) principles includes masking regions of an amorphous silicon film on a substrate and exposing intended active regions. Laser energy is directed against the intended active regions to anneal these regions without annealing the masked regions, thereby increasing production throughput and decreasing defect density.

15 Claims, 3 Drawing Sheets

US 6,265,250 B1

METHOD FOR FORMING SOI FILM BY LASER ANNEALING

TECHNICAL FIELD

The present invention relates generally to semiconductor fabrication, and more particularly to methods for fabricating improved ultra-large scale integration (ULSI) semiconductor devices such as ULSI metal oxide silicon field effect transistors (MOSFETs).

BACKGROUND OF THE INVENTION

Semiconductor chips are used in many applications, including as processor chips for computers, and as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

One general method for making semiconductor chips is referred to as the "bulk" CMOS method, wherein well implants are formed in a bulk silicon substrate to promote subsequent proper functioning of the chip, and then transistor stacks are formed on the substrate. A newer chip making method referred to as "silicon on insulator" or "SOI" has also been introduced which does not require the formation of wells in the substrate, and which provides for faster transistor switching speed, improved resistance to soft error and latch-up, and higher transistor density. Moreover, SOI chips advantageously consume less power when inactive compared to bulk CMOS chips.

As recognized by the present invention, however, the SOI process implicates complications, including the implantation of high doses of oxygen into the substrate. As understood herein, the high dose of oxygen that is required can lead to a relatively high defect rate in the SOI film, consequently requiring high temperature annealing for prolonged periods to alleviate the defects. Unfortunately, this in turn makes it difficult to precisely control the SOI film thickness, which is undesirable because a uniform SOI film thickness promotes optimal chip functioning. Also, because of the prolonged annealing, manufacturing throughput is lower than might be desired. Fortunately, the present invention has recognized the above problems and has provided the solutions herein.

BRIEF SUMMARY OF THE INVENTION

A method is disclosed for forming a silicon on insulator (SOI) device. The method includes depositing an amorphous silicon film on a substrate, and establishing protective stacks in the film. Active region windows are established over first regions of the film between protective stacks. Laser energy is then directed through the active region windows against the first regions to anneal the first regions. As disclosed further below, the first regions establish active SOI regions after annealing and cooling.

In one preferred embodiment, the protective stacks are made of an oxide. On the other hand, the substrate is made of a material selected from the group including: sapphire, silicon oxide, and silicon nitride.

The preferred method of establishing the active region windows includes masking the first regions of the film to establish stack windows over second regions of the film. The second regions of the film are then removed, and an oxide material is deposited to fill the stack windows. Next, the first regions are unmasked to establish the active region windows, prior to laser annealing.

In another aspect, an SOI semiconductor device includes a substrate and active regions of recrystallized silicon on the substrate disposed between inactive regions of oxide.

In yet another aspect, a method for making an SOI device includes providing a substrate, and depositing an amorphous silicon film on the substrate. Moreover, the method includes masking intended active regions of the film. Also, the method contemplates removing unmasked regions of the film to establish stack windows, and then depositing an oxide in the stack windows. The intended active regions are unmasked and activated using laser annealing followed by cooling.

In a preferred embodiment, the method includes heating the intended active regions to at least nine hundred degrees Celsius (900° C.). Indeed, the intended active regions can be heated to at least nine hundred fifty degrees Celsius (950° C.). Preferably, the activating act is accomplished by pulsing a laser beam against the intended active regions to melt the regions.

Other features of the present invention are disclosed or apparent in the section entitled "DETAILED DESCRIPTION OF THE INVENTION".

DETAILED DESCRIPTION OF THE INVENTION

Figure 1:
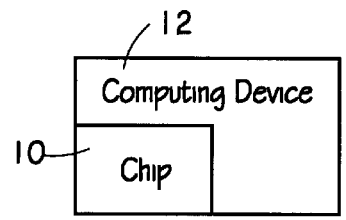
FIG. 1 is a schematic diagram of a semiconductor device made according to the present invention, shown in combination with a digital processing apparatus.

Referring initially to FIG. 1, a semiconductor device embodied as a chip 10 is shown incorporated into a digital processing apparatus such as a computer 12. The chip 10 is made in accordance with the below disclosure.

Figure 2:
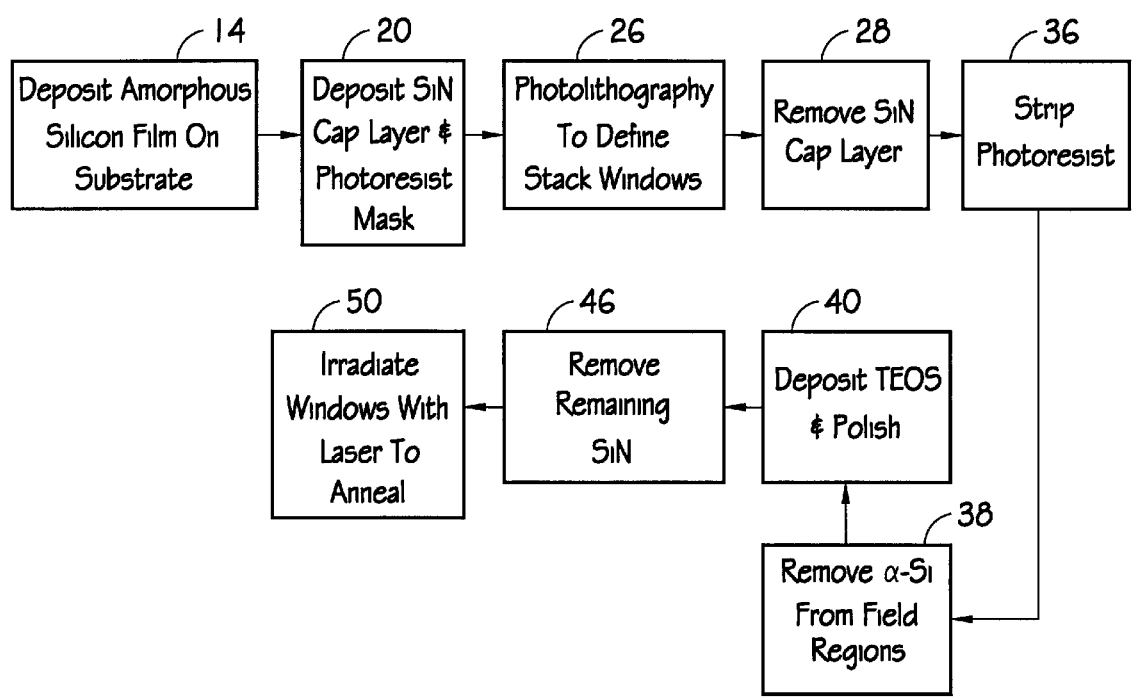
FIG. 2 is a flow chart showing the steps of the present invention.
Figure 3:
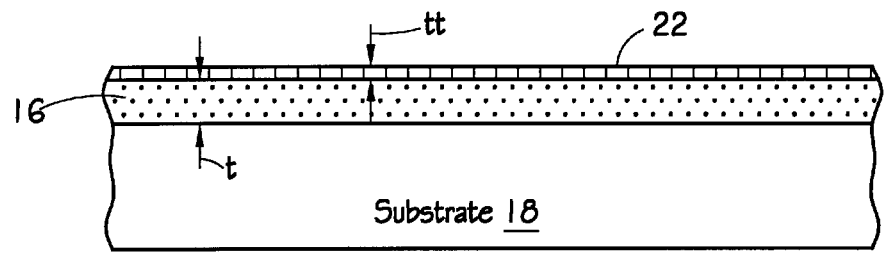
FIG. 3 is a schematic side view of the device after the SOI film and nitride cap layer have been deposited on the substrate.

Now referring to FIGS. 2 and 3, as indicated at block 14 in FIG. 2 and as shown in FIG. 3, to make the device 10 an amorphous silicon ("α-silicon") film 16 is deposited on a substrate 18 using appropriate deposition principles, e.g., low pressure chemical vapor deposition (LPCVD). The thickness "t" of the film 16 can be from one hundred Angstroms to five hundred Angstroms (100 Å–500 Å) or more. In any case, the substrate 18 has a melting temperature that is higher than the melting temperature of the α-silicon film 16. In one preferred embodiment, the substrate 18 can be made of sapphire, silicon oxide, or silicon nitride, or other appropriate, relatively high melting point substance.

Figure 4:
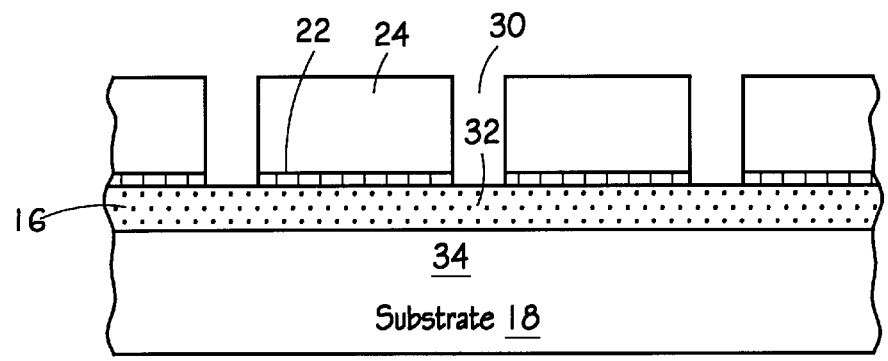
FIG. 4 is a schematic side view of the device after the photoresist layer has been deposited and patterned.

Moving to block 20 of FIG. 2 and referring to FIGS. 3 and 4, a protective cap layer 22 is deposited onto the α-silicon film 16. The cap layer 22 can be made of silicon nitride and can have a thickness "tt" of, e.g., three hundred Angstroms to five hundred Angstroms (300 Å–500 Å). As also indicated at block 20, a photoresist layer 24 is deposited over the cap layer 22, and then as indicated at block 26 the photoresist layer 24 is patterned as shown in FIG. 4 by, e.g., exposing the photoresist layer 24 to ultraviolet light to expose regions of the cap layer 22. These exposed regions of the cap layer 22 are removed at block 28 in FIG. 2 by, e.g., anisotropical plasma etching to define stack windows 30 over unmasked regions 32 of the α-silicon film 16. It is to be understood that the unmasked regions 32 of the α-silicon film 16 overlay intended field regions 34 of the substrate 18, as shown best in FIG. 4.

Figure 5:
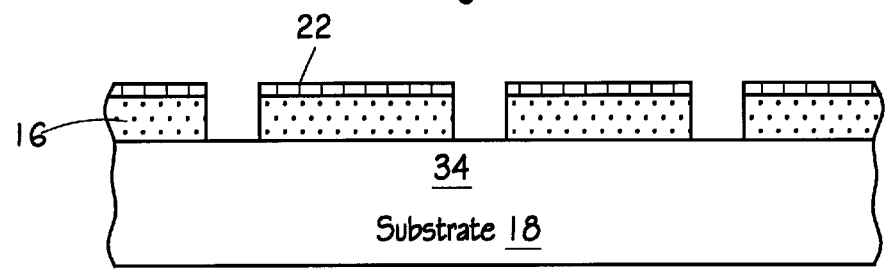
FIG. 5 is a schematic side view of the device after the photoresist layer has been stripped away and the nitride cap layer has been removed from the portions of the film intended to become the active portions.

After establishing the stack windows 30, the process moves to block 36 in FIG. 2 to remove the photoresist layer 24. Next, at block 38, the unmasked regions 32 (FIG. 4) of the α-silicon film 16 that overlay the intended field regions 34 of the substrate 18 are removed to render the configuration shown in FIG. 5. The unmasked regions 32 (FIG. 4) of the α-silicon film 16 can be removed by, e.g., wet or dry etching.

Figure 6:
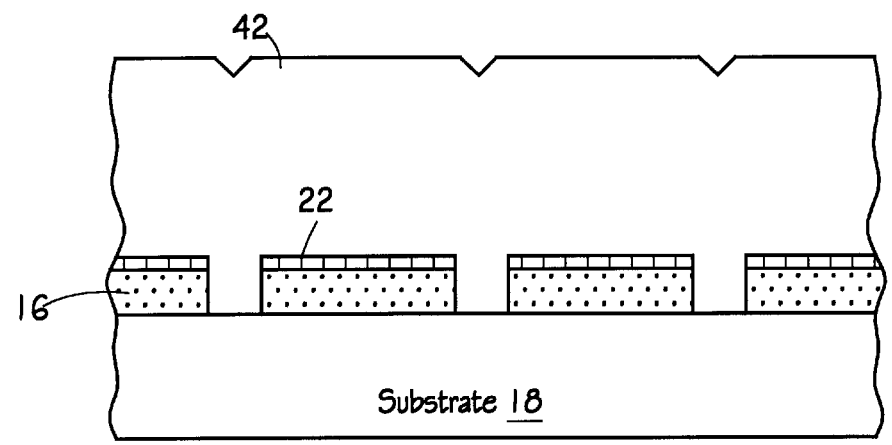
FIG. 6 is a schematic side view of the device after the TEOS layer has been deposited.
Figure 7:
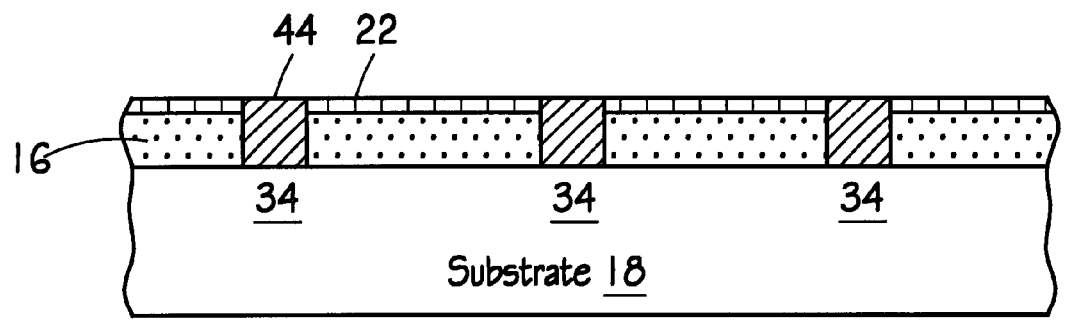
FIG. 7 is a schematic side view of the device after TEOS polishing.

Proceeding to block 40 of FIG. 2 and now referring to FIG. 6, a layer 42 preferably made of TEOS oxide is deposited over the substrate 18 as shown and polished down to the nitride cap layer 22 as shown in FIG. 7 to establish protective stacks 44 over the intended field regions 34. The layer 42 of TEOS can be polished down to the cap layer 22, which acts as a polish stop, using chemical mechanical polishing (CMP) principles.

Figure 8:
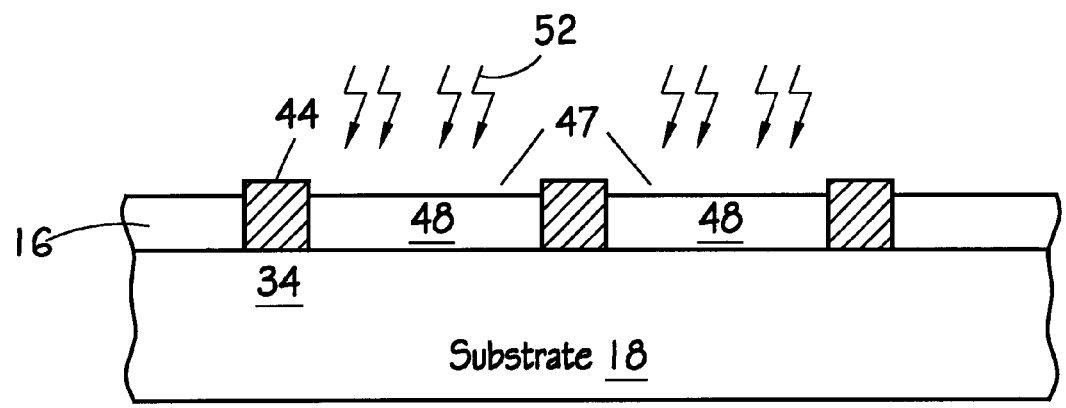
FIG. 8 is a schematic side view of the device during laser annealing.
Figure 9:
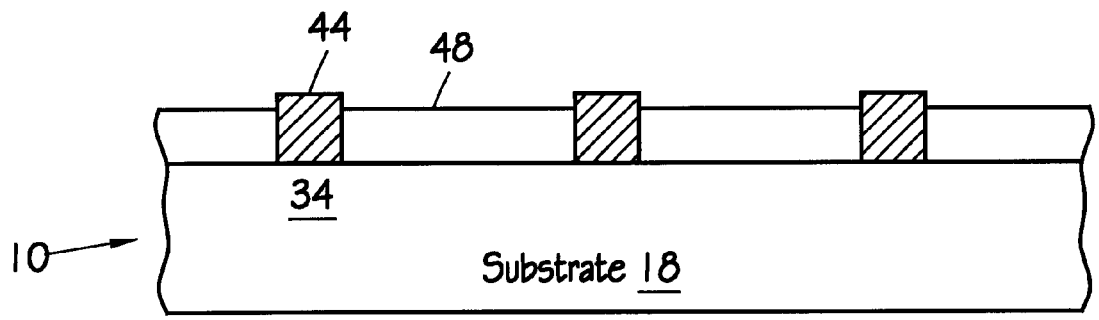
FIG. 9 is a schematic side view of the device after laser annealing.

Next moving to block 46 and referring to FIG. 8, the remaining areas of the cap layer 22 are removed to form active region windows 47 that expose intended active regions 48 of the α-silicon film 16. As shown, the intended active regions 48 alternate with the protective oxide stacks 44.

In accordance with the present invention, the intended active regions 48 are annealed at block 50 of FIG. 2. In one intended embodiment, the regions 48 are annealed by directing laser energy, represented by arrows 52 in FIG. 8, through the active region windows 47, against the regions 48. Thus, only the intended active regions 48 are annealed by the laser energy, with the intended field regions 34 of the substrate 18 being effectively shielded by the oxide stacks 44.

The laser energy preferably is an excimer laser beam that is pulsed at a period of a few nanoseconds to achieve a temperature in the exposed intended active regions 48 of at least nine hundred degrees Celsius, and as high as nine hundred fifty degrees Celsius or more. In this way, the α-silicon of the intended active regions 48 is melted, with the oxide stacks 44 masking the intended field regions 34 of the substrate 18 from the laser energy. The regions 48 are then cooled to room temperature to permit the silicon to recrystallize, establishing active regions of the device 10. During recrystallization, defects in the silicon are effectively removed.

While the particular METHOD FOR FORMING SOI FILM BY LASER ANNEALING as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims.

What is claimed is:

1. A method for forming a silicon on insulator (SOI) device, comprising:

depositing an amorphous silicon film on a substrate;

depositing a protective cap layer on said amorphous silicon film;

forming a plurality of protective stacks on the film, the forming of the stacks comprising:

depositing a photoresist layer on the protective cap layer, removing corresponding portions of both the photoresist layer and the protective cap layer to establish a plurality of stack windows, removing the remaining portions of the photoresist layer, removing corresponding portions of the amorphous silicon film, depositing an oxide material to at least fill the plurality of stack windows, polishing the oxide material down to the remaining portions of the protective cap layer, and removing the protective cap layer, thereby establishing a plurality of active region windows over a plurality of exposed film portions between each protective stack; and annealing the plurality of exposed film portions by directing and pulsing laser energy through the plurality of active region windows against the plurality of exposed film portions in a temperature range of at least nine hundred degrees Celsius ($\geq 900°$ C.) for a duration of a few nanoseconds.

thereby melting said amorphous silicon film to recrystallize the exposed film portions, and thereby forming a plurality of active regions comprising a plurality of recrystallized exposed film portions.

2. A method of claim 1, wherein the melting temperature of the substrate is higher than the melting temperature of the amorphous silicon film.

3. A method of claim 2, wherein the substrate comprises one material selected from a group consisting essentially of sapphire, silicon oxide, and silicon nitride.

4. A method for making an SOI device, comprising the acts of:

providing a substrate;

depositing an amorphous silicon film on the substrate;

depositing a protective cap layer on said amorphous silicon film;

forming a plurality of protective stacks on the film, the forming of the stacks comprising:

depositing a photoresist layer on the protective cap layer, removing corresponding portions of both the photoresist layer and the protective cap layer to establish a plurality of stack windows, removing the remaining portions of the photoresist layer, removing corresponding portions of the amorphous silicon film, depositing an oxide material to at least fill the plurality of stack windows, polishing the oxide material down to the remaining portions of the protective cap layer, and removing the protective cap layer, thereby establishing a plurality of active region windows over a plurality of exposed film portions between each protective stack; and activating the plurality of exposed film portions by using pulsed laser annealing in a temperature range of at least nine hundred degrees Celsius ($\geqq 900°$ C.) for a duration of a few nanoseconds to melt said plurality of exposed film portions, and cooling the plurality of melted exposed film portions, thereby recrystallizing said plurality of melted exposed film portions, thereby forming a plurality of active regions of said device, and thereby effectively eliminating defects in said plurality of active regions.

5. A method of claim 4, wherein the melting temperature of the substrate is higher than the melting temperature of the amorphous silicon film.

6. A method of claim 5, wherein the substrate comprises one material selected from a group consisting essentially of sapphire, silicon oxide, and silicon nitride.

7. A method of claim 4, wherein the activating step is accomplished by heating the plurality of exposed film portions in a temperature range of at least nine hundred fifty degrees Celsius ($\geqq 950°$ C.).

8. A method of claim 4, wherein the activating step is accomplished by pulsing a laser beam against the plurality of exposed film portions to melt the plurality of exposed film portions.

9. A method of claim 1, wherein said film depositing step is performed by a low pressure chemical vapor deposition (LPCVD).

10. A method of claim 1, wherein said amorphous silicon film has a thickness in a range of 100 Å to 500 Å.

11. A method of claim 1, wherein said protective cap layer comprises silicon nitride.

12. A method of claim 1, wherein said protective cap layer has a thickness in a range of 300 Å to 500 Å.

13. A method of claim 1, wherein said photoresist depositing step comprises developing a photoresist mask.

14. A method of claim 1, wherein said oxide material comprises a tetraethylorthosilicate (TEOS) oxide.

15. A method of claim 1, wherein the annealing step is accomplished by heating the plurality of exposed film portions in a temperature range of at least nine hundred fifty degrees Celsius ($\geqq 950°$ C.).

\* \* \* \* \*